United States Patent
Fleishman

(10) Patent No.: US 9,136,861 B1
(45) Date of Patent: Sep. 15, 2015

(54) SYSTEM AND METHOD FOR ENHANCING DYNAMIC RANGE OF A BEAMFORMING MULTI-CHANNEL DIGITAL RECEIVER

(71) Applicant: Elta Systems Ltd., Ashdod (IL)

(72) Inventor: Baruch Fleishman, Rehovot (IL)

(73) Assignee: ELTA SYSTEMS LTD., Ashdod (IL)

( * ) Notice: Subject to any disclaimer, the term of this patent is extended or adjusted under 35 U.S.C. 154(b) by 0 days.

(21) Appl. No.: 14/544,851

(22) Filed: Feb. 25, 2015

(30) Foreign Application Priority Data

Feb. 26, 2014 (IL) .......................................... 231163

(51) Int. Cl.
*H03M 1/20* (2006.01)
(52) U.S. Cl.
CPC ..................................... *H03M 1/201* (2013.01)
(58) Field of Classification Search
CPC .. H04B 7/0617; H04B 7/0408; H04B 7/0671; H04B 7/0697; H04B 7/086; H04M 1/0626; H04M 1/0639; H04M 1/0641; H04M 1/12; H04M 1/66; H04Q 11/0005; H04Q 2011/003; H04Q 2011/0039
USPC ......... 341/131, 137, 138; 455/65, 562, 277.1, 455/296, 272, 148; 375/267, 347, 349, 145
See application file for complete search history.

(56) References Cited

U.S. PATENT DOCUMENTS

| | | |
|---|---|---|
| 3,656,152 A | 4/1972 | Gundersen |
| 4,144,577 A | 3/1979 | Ley |
| 4,800,364 A | 1/1989 | Mortara |
| 5,189,418 A | 2/1993 | Bartz et al. |
| 5,305,005 A | 4/1994 | Nakagawa et al. |
| 5,406,949 A * | 4/1995 | Yao et al. ...................... 600/457 |
| 6,016,113 A | 1/2000 | Binder |
| 6,175,320 B1 * | 1/2001 | Heflinger ..................... 341/137 |
| 6,320,899 B1 * | 11/2001 | Chang et al. .................. 375/147 |

(Continued)

FOREIGN PATENT DOCUMENTS

JP  2001-332972  11/2001

OTHER PUBLICATIONS

Search Report issued in corresponding European Application No. 15155180.1 dated Jul. 6, 2015.

*Primary Examiner* — Linh Nguyen
(74) *Attorney, Agent, or Firm* — Frommer Lawrence & Haug LLP; William S. Frommer

(57) ABSTRACT

A system and method for enhancing a dynamic range of a beamforming multi-channel digital receiver are described. The receiver comprises a plurality of receiving channels, each including an analog-to-digital converter configured for converting an analog input signal generated by antenna elements into a digital signal. A "spatial" dither signal is used to decorrelate the quantization noise of the analog-to-digital converters. A dither signal is generated and split into a predetermined number of coherent dithering signals. The method includes providing predetermined time delays to the coherent dithering signals, and adding the delayed coherent dithering signals to the input signals in each receiving channel, correspondingly, thereby creating a dither signal equivalent to a signal arriving from a certain specific direction out-of-field-of-view of the antenna array. Removing of the dither signal based on the direction of arrival, is implemented during beamforming signal processing, thus enhancing the dynamic range of electromagnetic signals arriving within a field-of-view of the antenna array.

20 Claims, 7 Drawing Sheets

(56) References Cited

U.S. PATENT DOCUMENTS

| | | | |
|---|---|---|---|
| 6,356,221 B1* | 3/2002 | LeChevalier | 341/137 |
| 6,731,234 B1* | 5/2004 | Hager et al. | 342/94 |
| 7,411,996 B2* | 8/2008 | Kim | 375/148 |
| 8,953,728 B2* | 2/2015 | Chang | 375/349 |
| 2004/0033791 A1* | 2/2004 | Schmidl et al. | 455/137 |
| 2005/0176368 A1* | 8/2005 | Young et al. | 455/11.1 |
| 2008/0108310 A1* | 5/2008 | Tong et al. | 455/69 |
| 2008/0240170 A1* | 10/2008 | Elmala et al. | 370/517 |
| 2010/0178065 A1* | 7/2010 | Nishihara et al. | 398/202 |
| 2010/0283654 A1 | 11/2010 | Waheed et al. | |
| 2011/0021208 A1* | 1/2011 | Sheynblat | 455/456.1 |
| 2012/0013494 A1 | 1/2012 | Song | |

\* cited by examiner

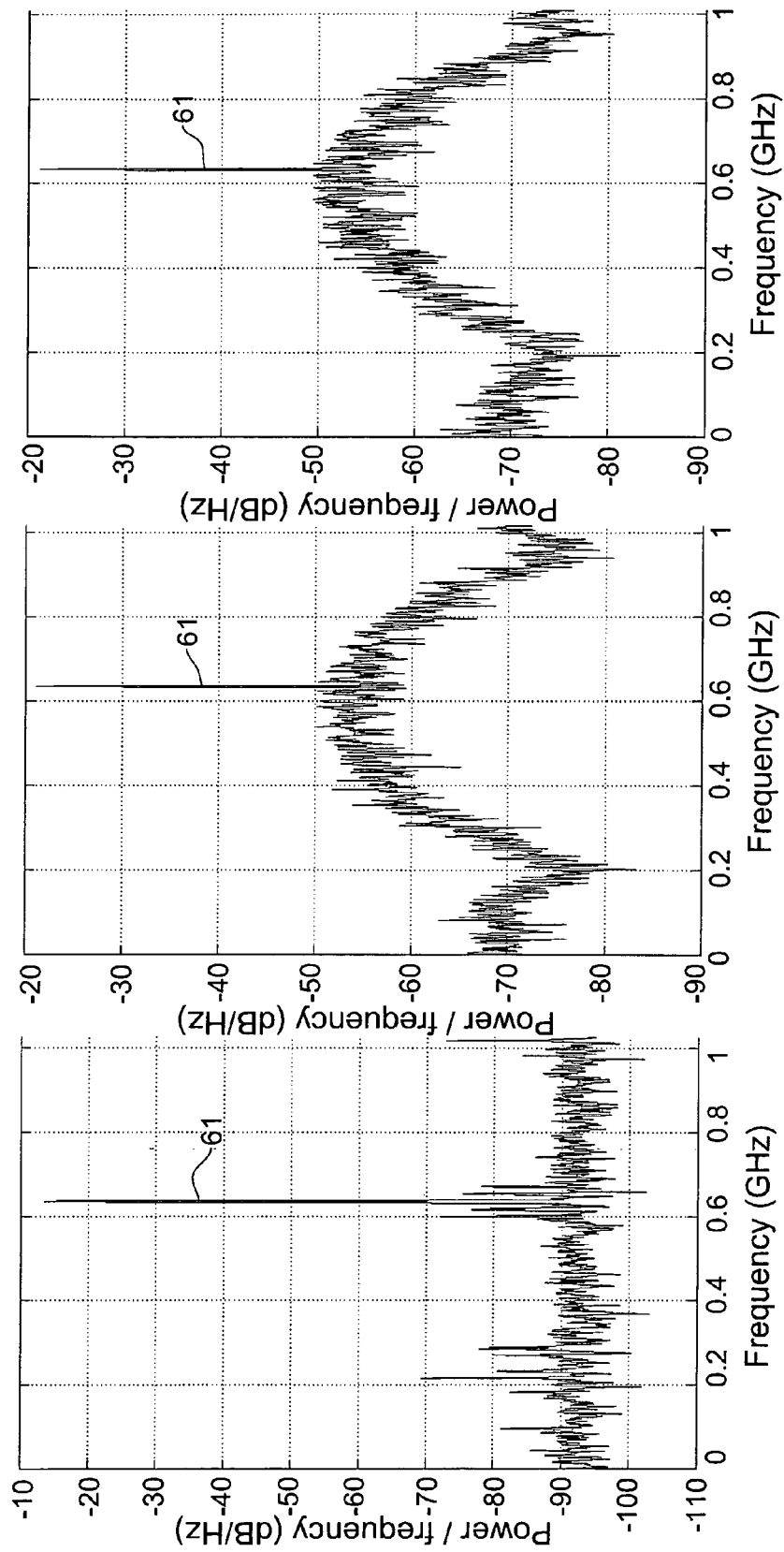

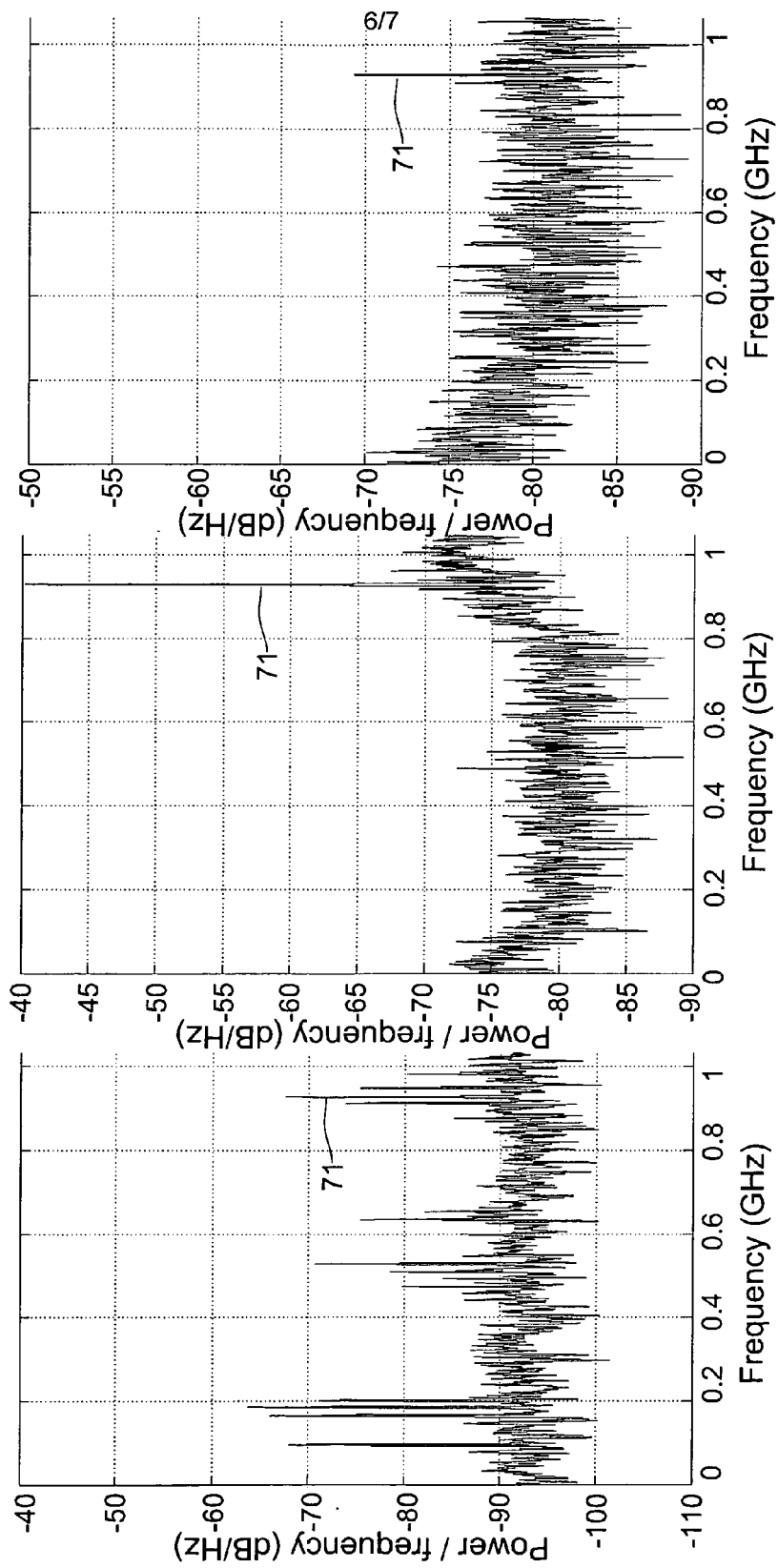

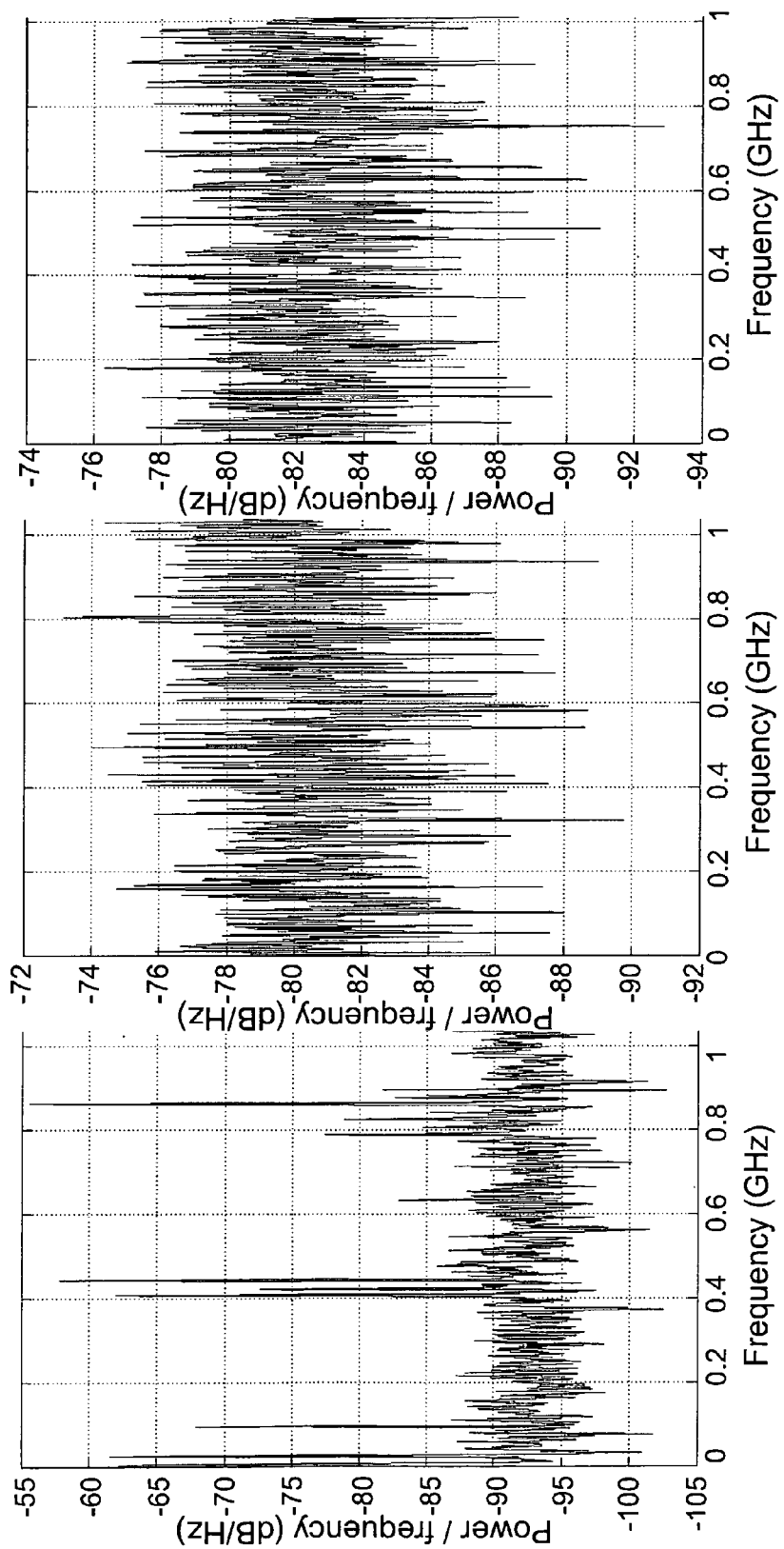

SYSTEM AND METHOD FOR ENHANCING DYNAMIC RANGE OF A BEAMFORMING MULTI-CHANNEL DIGITAL RECEIVER

FIELD OF THE INVENTION

This invention relates to the field of electronically steered antenna techniques, and in particular, to multi-channel receiver systems and methods that use dithering to improve dynamic range performance of multiple analog-to-digital converters.

BACKGROUND OF THE INVENTION

Dynamic range is an important characteristic of electronically steered antenna array systems based on a multi-channel digital receiver configured for detecting, processing and estimating parameters of two or more high and low power level signals received from several simultaneously operating emitters. Instantaneous dynamic range of a multi-channel digital receiver operating with signals originating from simultaneously operating plurality transmitters is typically defined as the maximum ratio of the highest and lowest power level signals that may be detected such that the signal parameters can be accurately estimated. Enhancement of the receiver instantaneous dynamic range is increasingly important in applications where accurate digital signal processing, originating from lower level transmitters, is required.

Referring to FIG. 1, a general schematic block diagram of a prior art multi-channel digital receiver 10 is illustrated. The receiver 10 includes an antenna array 11 of antenna elements 12 connected to a plurality of parallel receiver channels 13 arranged downstream of the antenna array 11, a digital beam forming unit 14 arranged downstream of the receiver channels 13, and a signal processor unit 15 arranged downstream of the digital beam forming unit 14. Each receiver channel 13 includes an analog amplifier 131 and an analog-to-digital converter (ADC) 132.

In operation, the ADC 132 samples the channel signal and produces an ADC channel output that can be characterized by a sampling frequency and by a number of bits. The digital beamforming unit 14 receives the ADC channel outputs from the multiple channels and computes a digital beam by multiplying each channel by beamforming weights and computing sums. As a result of the beamforming process, signals arriving from a certain specific direction are selected and amplified, while all signals arriving from other directions are attenuated. In addition to the beamforming process, unwanted signal from another certain direction can be suppressed and removed by steering beam pattern nulls in this direction, while maintaining the main lobe in the selected direction.

Usually, a relatively large number, e.g., up to a thousand or possibly more digital receiver channels may be required to form narrow beams for high spatial selectivity of such a receiver.

Generally, there is a relation between the number of bits and the instantaneous dynamic range of analog-to-digital converters (ADCs). According to this relation, a higher instantaneous dynamic range is obtained for the ADCs with higher quantization levels (i.e., with a higher number of bits) in the output. However, wideband ADCs with a large number of effective bits usually require high power consumption in signal processing. Moreover, such ADCs with a high number of quantization levels are usually complex and costly to implement. Accordingly, implementation of high dynamic range multi-bit wideband ADCs in the multi-channel system, as shown in FIG. 1, is not practical.

On the other hand, the use of ADCs with a high sampling rate and a low number of bits in a multi-channel receiver may result in low power consumption, and provide a simple and cost effective solution. However, the dynamic range of ADCs with a low number of bits usually suffers from high level quantization errors that add quantization noise to the output. As a result of quantization errors, together with high order harmonics of the strong signal, a noise is produced which can cause misdetection of low level signals received simultaneously with high power level signals. Additionally, these high order harmonics can create false alarm detections.

One of the possible solutions for improving the dynamic range of the analog to digital conversions is to use dithering, also known as quantization error dispersion. In general, the technique involves adding a dither signal to an analog signal prior to its conversion to a digital value in order to decorrelate the quantization noise from the input signal and randomize quantization error, thereby to enhance the resolution of the analog to digital converter. The dither signal itself can, for example, be random white noise, band limited random noise, a periodic ramp, square wave, triangle wave sweep, etc.

FIG. 2 shows a schematic block diagram illustrating a conventional AD conversion circuit 20 where a dither signal is added to the analog input signal. The AD conversion circuit 20 includes a signal combiner 21, an AD converter (ADC) 22, a dither signal generator (DSG) 23 and a dither signal remover 24. In operation, the analog dither signal is added to the analog input signal before conversion to digital form. The lesser the ADC's bit number, the greater the dither level must be. The combined signal is then converted via ADC 22. Care must be taken when choosing the level of dithering to ensure that that the dynamic range is not compromised owing to the increase in the level of noise in the ADC. After conversion, further digital signal processing, for example, a fast Fourier transform (FFT), may be required to minimize desensitization (i.e. loss of sensitivity) caused by the dither signal. Thus, suppression of the dither signal is usually implemented in the signal post processing after the analog to digital conversion in order to minimize impact on the sensitivity of the output. In particular, suppression of the dithering signal can be based on the knowledge of specific characteristics of the dithering signal. Accordingly, the dither signal can finally be removed digitally by the dither signal remover 24 to produce a digital output signal.

Referring to FIG. 3, a general schematic block diagram of a multi-channel digital receiver 30 is illustrated, according to another example. In order to improve the performance of the beamforming multi-channel digital receiver shown in FIG. 1, each receiver channel 13 further includes a channel dither signal generator (DSG) 31 together with a channel signal combiner 32 arranged upstream of an analog-to-digital converter (ADC) 33. In operation, adding individual dither signals in each channel improves dynamic range performance of this channel of the multi-channel digital receiver.

SUMMARY OF THE INVENTION

Despite prior art in the area of electronically steered antenna array techniques, there is still a need to provide relatively simple and compact implementation of a wide band multi-beam receiver.

It would be useful to have a further improvement of dynamic range performance of a multi-channel digital receiver.

It would be advantageous to have a system and method enabling decorrelation of a quantization noise of the analog-to-digital converters arranged in receiving channels of the multi-channel digital receiver.

It would be advantageous to have a system and method providing a relatively high dynamic range even for a mono-bit A/D converter.

Thus, the present invention partially eliminates the deficiencies of the prior art electronically steered antenna array techniques implemented in a beamforming multi-channel digital receiver, and provides a system for enhancing a dynamic range of such a beamforming multi-channel digital receiver. The system includes an antenna array having a plurality of antenna elements. The antenna array is configured for receiving electromagnetic signals and generating analog input signals to the beamforming multi-channel digital receiver. The system also includes a plurality of parallel receiving channels coupled to the antenna elements. Each parallel receiving channel includes an analog-to-digital (AD) converter. The analog-to-digital converter can be a mono-bit AD converter.

The system further includes a dithering module. According to an embodiment of the present invention, the dithering module includes a dither signal generator configured for generating a dither signal, a multi-channel splitter arranged downstream of the dither waveform generator, and a plurality of time delay units arranged downstream of the multi-channel splitter in a parallel relation. The multi-channel splitter is configured for splitting the dither signal into a predetermined number of coherent dithering signals assigned to the parallel receiving channels. According to an embodiment of the present invention, the time delay units are configured for providing predetermined time delays to the coherent dithering signals in the corresponding receiving channels. According to an embodiment of the present invention, the corresponding time delays provided by the time delay units are equivalent to time delays of the signals arriving from a selected specific direction. According to one embodiment of the present invention, the specific direction is selected from an out-of-field-of-view of the antenna array.

The system further includes a plurality of combiners arranged in the parallel receiving channels upstream of the analog-to-digital converters and coupled to the time delay units. According to an embodiment of the present invention, each combiner is configured for receiving the analog input signal originating from the corresponding antenna element and adding the delayed coherent dithering signal having the corresponding predetermined time delay to the analog input signal, generating a combined analog signal including the delayed coherent dithering signal and the analog input signal, and relaying the combined analog signal to the analog-to-digital converter for digitizing thereof.

According to an embodiment of the present invention, the system further includes a digital beam forming unit arranged downstream of the parallel receiving channels and coupled to the analog-to-digital converters. The digital beam forming unit is configured for receiving combined digital signals digitized by the analog-to-digital converters, and computing a digital beam associated with the electromagnetic signals arrived from a certain specific direction, while attenuating the electromagnetic signals arriving from other directions.

According to an embodiment of the present invention, the digital beam forming unit is further configured for removing, from the combined digital signals, a digital counterpart waveform of the delayed coherent dithering signals added to the analog input signals corresponding to the specific direction of the antenna array. This removing can, for example, be carried out by a null-steering technique.

According to an embodiment of the present invention, the system further includes a signal processor unit arranged downstream of the digital beam forming unit. The signal processor unit is configured for processing the digital beam associated with the electromagnetic signal arriving from the certain specific direction. According to an embodiment of the present invention, the processing includes estimation of required parameters associated with said electromagnetic signal arriving from the certain specific direction.

According to an embodiment of the present invention, the dithering module further includes a filter arranged downstream of the dither signal generator. The filter can be a low pass filter or a band pass filter and configured for limiting a frequency band of the dither signal such that the injected dither signal is in the spectrum area out-of-band of the received analog input signals.

According to an embodiment of the present invention, the dither signal generator includes a noise source configured for generating a random noise waveform. In this case, the dither signal includes a random noise waveform. When the dithering module further includes a filter, after filtering, the frequency band of the random noise waveform is out-of-band with respect to the analog input signals.

According to an embodiment of the present invention, the dithering module further includes a variable attenuator arranged upstream of the multi-channel splitter, and is configured for setting a magnitude of the dither waveform to an optimal level. For example, the optimal level can be in the range of approximately −3 dB to 3 dB of the maximum operational signal level of the analog input signal.

According to another general aspect of the present invention, there is provided a method for enhancing a dynamic range of a beamforming multi-channel digital receiver described above. According to an embodiment of the present invention, the method includes generating a dither signal and splitting the dither signal into a predetermined number of coherent dithering signals. The predetermined number is equal to the number of the receiving channels. According to an embodiment of the present invention, the generating of the dither signal includes generating a random noise waveform. In this case, the dither signal includes generating a random noise waveform.

According to an embodiment of the present invention, the method also includes providing predetermined time delays to the coherent dithering signals in the receiving channels, correspondingly. The time delays are equivalent to time delays of signals arriving from a specific direction selected from an out-of-field-of-view of the antenna array.

In each receiving channel, the analog input signal originating from the corresponding antenna element is received and added to the corresponding delayed coherent dithering signal having a corresponding predetermined time delay, thereby generating a combined analog signal that includes the corresponding delayed coherent dithering signal and the corresponding analog input signal.

According to an embodiment of the present invention, the method further includes digitizing the combined analog signal. As a result of the digitizing, a combined digital signal, having a decorrelated quantization noise, is obtained.

The combined digital signals corresponding to the plurality of receiving channels are relayed to the digital beam forming unit that computes a digital beam associated with the electromagnetic signals arriving from a certain specific direction, while attenuating the electromagnetic signals arriving from other directions.

According to an embodiment of the present invention, a digital counterpart waveform of the delayed coherent dithering signals added to the analog input signals is removed from the combined digital signals. The removing of the digital counterpart waveform of the delayed coherent dithering signals can, for example, be carried out by a null-steering technique.

According to an embodiment of the present invention, the digital beam associated with the electromagnetic signal, arriving from the certain specific direction, computed by the beam forming unit, is further processed. The processing, inter alia, can include removing, from the digital beam, a digital counterpart waveform of the delayed coherent dithering signals added to the analog input signals that correspond to the certain specific direction, and estimating required parameters associated with said electromagnetic signal arriving from the certain specific direction.

According to an embodiment of the present invention, the method further includes limiting a frequency band of the dither signal prior to splitting thereof.

According to an embodiment of the present invention, the method further includes setting a magnitude of the dither signal to an optimal level prior to splitting thereof. The optimal level can, for example, be in the range of approximately −3 dB to 3 dB of the maximum operational signal level of the analog input signal.

There has thus been outlined, rather broadly, the more important features of the invention in order that the detailed description thereof that follows hereinafter may be better understood. Additional details and advantages of the invention will be set forth in the detailed description, and in part will be appreciated from the description, or may be learned by practice of the invention.

BRIEF DESCRIPTION OF THE DRAWINGS

In order to understand the invention and to see how it may be carried out in practice, a preferred embodiment will now be described, by way of non-limiting example only, with reference to the accompanying drawings, in which:

FIGS. 6A-6C illustrate examples of a power spectrum of signals received from two transmitters by a beamforming multi-channel receiver when a beam is pointed towards the first transmitter. The signal received from the first transmitter has a power level higher than the signal received from the second transmitter;

FIGS. 7A-7C illustrate examples of a power spectrum of signal received from two transmitters by a beamforming multi-channel receiver when a beam is pointed towards the second transmitter. The signal received from the first transmitter has a power level higher than the signal received from the second transmitter; and FIGS. 8A-8C illustrate examples of a power spectrum of signals received from two transmitters by a beamforming multi-channel receiver when a beam is pointed towards direction between these transmitters without any other transmitters within the beam.

DETAILED DESCRIPTION OF EMBODIMENTS

Figure 1:
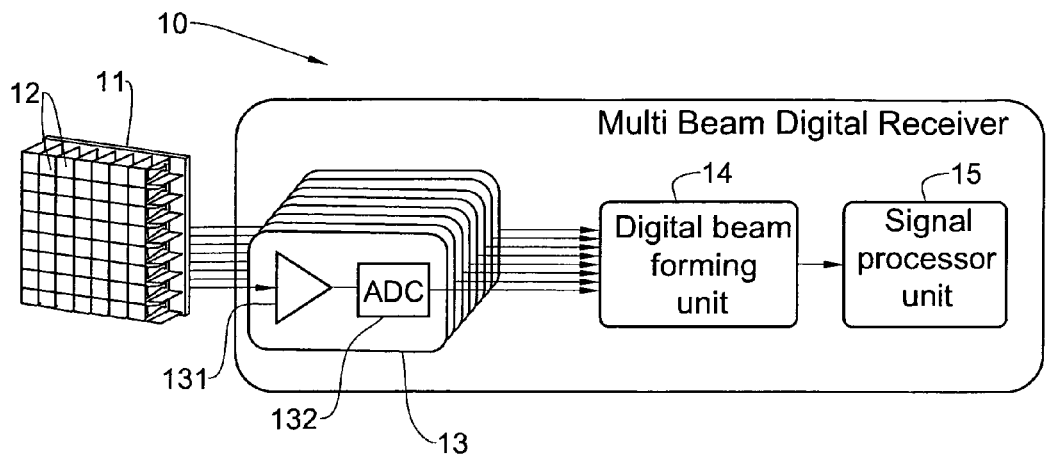
FIG. 1 illustrates a general schematic block diagram of a prior art multi-channel digital receiver, according to an example.
Figure 2:
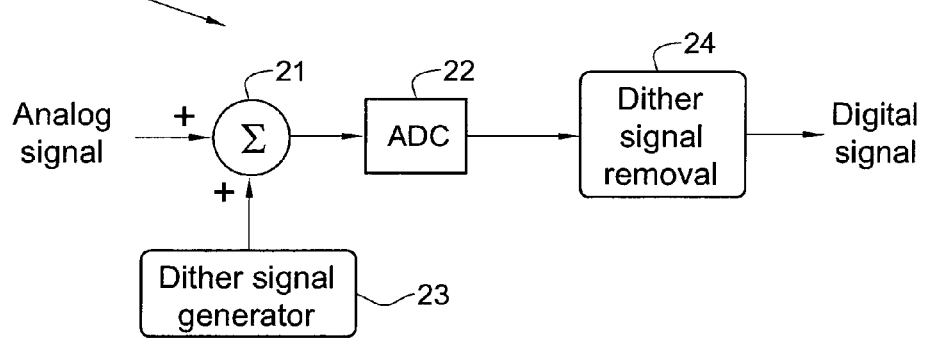
FIG. 2 illustrates a schematic block diagram illustrating a conventional AD conversion circuit where a dither signal is added to the analog input signal.
Figure 3:
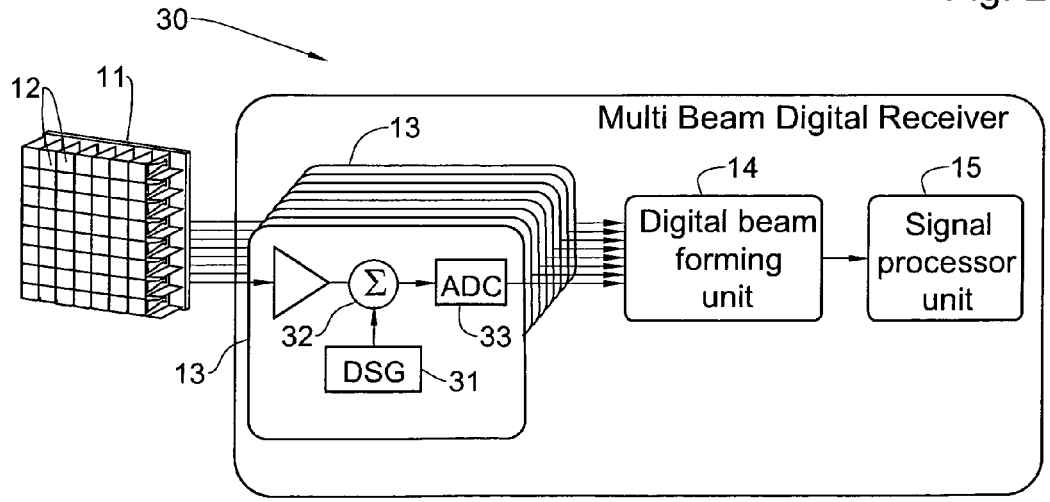
FIG. 3 illustrates a general schematic block diagram of a prior art multi-channel digital receiver, according to another example.

The principles and operation of the multi-channel digital receiver according to the present invention may be better understood with reference to the drawings and the accompanying description, it being understood that these drawings and examples in the description are given for illustrative purposes only and are not meant to be limiting. Skilled artisans will appreciate that elements and graphs in the figures are illustrated for simplicity and clarity and have not necessarily been drawn to scale. For example, the dimensions of some of the elements in the figures may be exaggerated relative to other elements to help improve understanding of various embodiments. In addition, the description and drawings do not necessarily require the order illustrated. It will be further appreciated that certain actions and/or steps may be described or depicted in a particular order of occurrence while those skilled in the art will understand that such specificity with respect to sequence is not actually required.

System, device and method components have been represented, where appropriate, by conventional symbols in the drawings, showing only those specific details that are pertinent to understanding the various embodiments so as not to obscure the disclosure with details that will be readily apparent to those of ordinary skill in the art having the benefit of the description herein. Thus, it will be appreciated that for simplicity and clarity of illustration, common and well-understood elements that are useful or necessary in a commercially feasible embodiment may not be depicted in order to facilitate a less obstructed view of these various embodiments.

It should be noted that the blocks in the drawings illustrating various embodiments of the present invention are intended as functional entities only, such that the functional relationships between the entities are shown, rather than any physical connections and/or physical relationships.

Some portions of the detailed descriptions, which follow hereinbelow, are presented in terms of algorithms and/or symbolic representations of operations on data represented as physical quantities within registers and memories of a computer system. An algorithm is here conceived to be a sequence of steps requiring physical manipulations of physical quantities and leading to a desired result. Usually, although not necessarily, these quantities take the form of electrical or magnetic signals capable of being stored, transferred, combined, compared, and otherwise manipulated. In the present description, these signals can be referred to as values, elements, symbols, terms, numbers, or the like.

Figure 4:
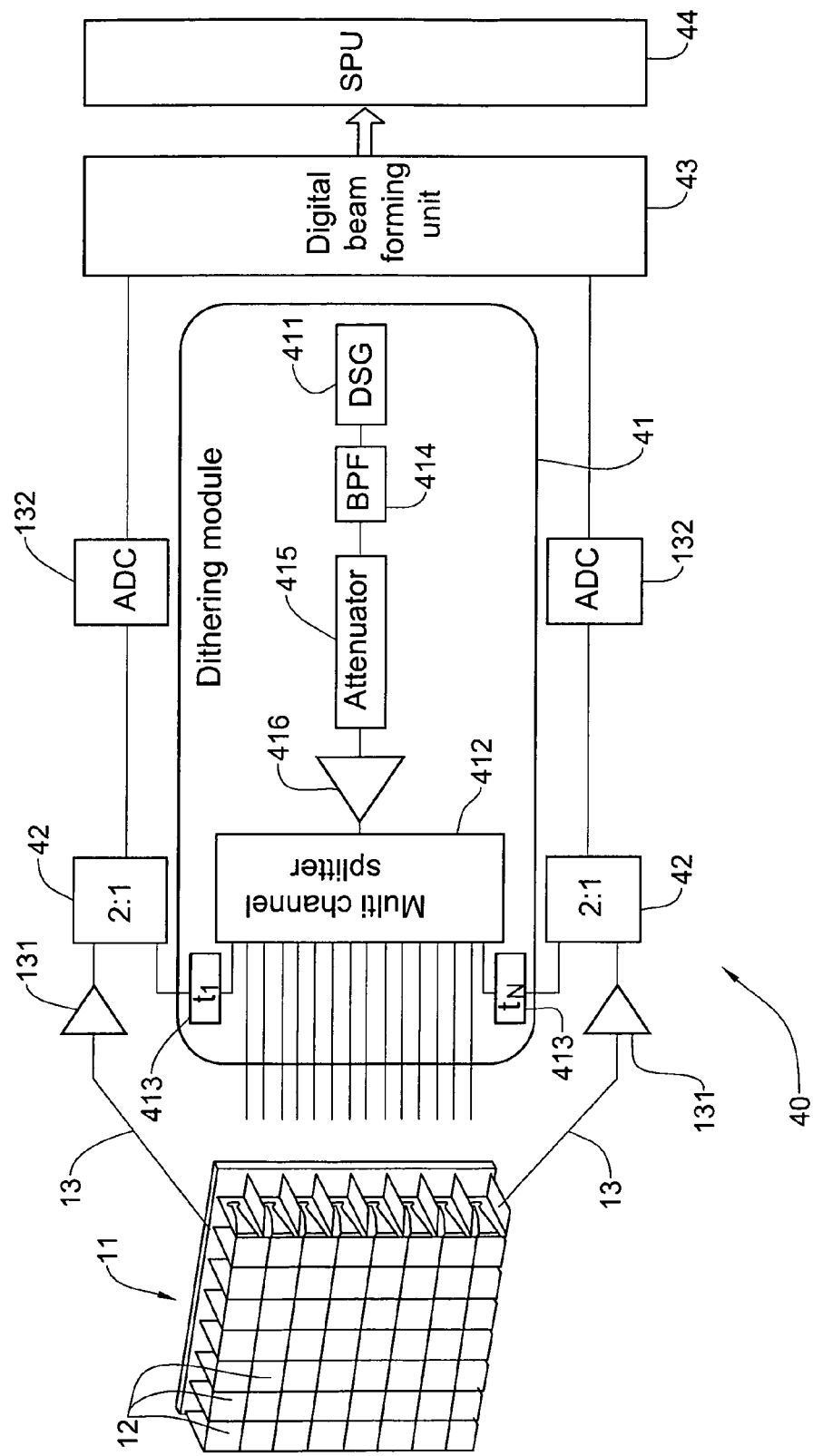
FIG. 4 illustrates a general schematic block diagram of a multi-channel digital receiver, according to one embodiment of the present invention.

Referring now to FIG. 4 a general schematic block diagram of a system 40 for enhancing a dynamic range of a multi-channel digital receiver (10 in FIG. 1) is illustrated, according to one embodiment of the present invention. The system 40 includes such conventional components of the multi-channel digital receiver 10 as an antenna array 11 including a plurality of antenna elements 12 configured for receiving electromagnetic signals and generating counterpart analog input signals.

The system 40 also includes a plurality of parallel receiving channels 13 coupled to the antenna elements 12, correspondingly. A number N of the parallel receiving channels 13 is equal to the number of the antenna elements 12. Each parallel receiving channel 13 includes analog amplifier 131 coupled to the corresponding antenna element 12 of the antenna array 11. Moreover, each parallel receiving channel 13 includes an analog-to-digital converter (ADC) 132 configured for converting an analog signal into a digital signal.

When desired, the receiver channels 13 may also include a radio frequency (RF) receiver (not shown) arranged downstream of the antenna array 11, and configured for converting incoming RF signals generated by the antenna elements 12 into an intermediate frequency (IF) before digitizing.

According to an embodiment of the present invention, the system 40 includes a dithering module 41. The dithering module 41 includes a dither signal generator (DSG) 411, a multi-channel splitter 412 arranged downstream of the dither waveform generator, and a plurality of time delay units 413 arranged in a parallel relation downstream of the multi-channel splitter 412. The dither signal generator 411 is configured for generating a dither signal.

According to an embodiment of the present invention, the dither signal generator 411 includes a noise source (not shown) configured for generating a random noise waveform. Accordingly, the dither signal includes a random noise waveform.

The multi-channel splitter 412 is configured for splitting the dither signal into a predetermined number of coherent dithering signals assigned to the plurality of parallel receiving channels. The predetermined number is equal to the number of the receiving channels. The time delay units 413 are configured for providing time delays to the coherent dithering signal in the receiving channels. Each time delay unit 413 provides a predetermined time delay to the dithering signal associated with the corresponding receiving channel. Each time delay is set to a predetermined value corresponding to the location of the antenna element 12 in antenna array 11.

According to an embodiment of the present invention, the corresponding time delays provided by the time delay units 413 are equivalent to a time delay of signals arriving at the antenna array from a specific direction selected from out-of-field-of-view of the antenna array 11. In particular, each time delay unit 413 is configured to provide a dedicated time delay $t_i$ that corresponds to a time required for a dithering signal to arrive from a certain specific direction out-of-field-of-view of the antenna array. This provision of time delays ($t_i$; i=1, 2, ..., and N, where N is the number of the parallel receiving channels 13) is equivalent to a situation where each time delay unit 413 provides the corresponding dither signal arriving from the corresponding place in the space. The time delays take into account the location of the antenna elements 12 in the antenna array 11. Thus, the dithering scheme described above can be referred to as "spatial dithering".

According to an embodiment of the present invention, the system 40 further includes a plurality of combiners 42 arranged in the parallel receiving channels 13 upstream of the analog-to-digital converters 132, and coupled to the time delay units 413. Each combiner 42 is configured for receiving the analog input signal originating from the corresponding antenna element 12 and adding the delayed coherent dithering signal having the corresponding predetermined time delay to the analog input signal and generating a combined analog signal. The combined analog signal includes the delayed coherent dithering signal and the analog input signal. The combined analog signal is relayed to the analog-to-digital converter 132 for digitizing thereof.

According to an embodiment of the present invention, the system 40 further includes a digital beam forming unit 43 arranged downstream of the receiving channels 13 and coupled to the analog-to-digital converters 132. The digital beam forming unit 43 is configured for receiving combined digital signals digitized by the analog-to-digital converters 132 and computing a digital beam associated with the electromagnetic signals arriving from a certain specific direction, while attenuating the electromagnetic signals arriving from other directions. The digital beam forming unit 43 is further configured for removing, from the combined digital signals, a digital counterpart waveform of the delayed coherent dithering signals added to the analog input signals that correspond to the certain direction. The removing of the digital counterpart waveform of the delayed coherent dithering signals can, for example, be carried out by a null-steering technique.

According to an embodiment of the present invention, the system 40 further includes a signal processor unit 44 arranged downstream of the digital beam forming unit 43. The signal processor unit 44 is configured for processing the digital beam associated with the electromagnetic signal arriving from the direction of the field-of-view. In processing, the signal processor unit 44 selects beams, performs filtering in frequency domain, signal detection, and estimates required signal parameters.

According to an embodiment of the present invention, the dithering module 41 of the system 40 further includes a filter 414 arranged downstream of the dither signal generator 411. The filter 414 can be a low pass filter or a band pass filter and configured for limiting a frequency band of the dither signal to out-of-band of interest spectrum area. For instance, when the dither signal includes a random noise waveform, the frequency band of the random noise waveform after filtering is out-of-band with respect to the analog input signals from the antenna array 11.

According to an embodiment of the present invention, the dithering module 41 of the system 40 further includes a variable attenuator 415 arranged upstream of the multi-channel splitter 412 and is configured for setting a magnitude of the dither signal to an optimal level. When the dithering module 41 includes the filter 414, the variable attenuator 415 is arranged downstream of the filter 414. The optimal level can, for example, be in the range of −3 dB to 3 dB of the maximum signal level of the analog input signal. When desired, the dithering module 41 can include an amplifier 416 for amplifying the dither signal.

In operation, a dither signal is generated by the dither signal generator 411. According to an embodiment, the generating of the dither signal includes generating a random noise waveform. The dither signal is split into a predetermined number of coherent dithering signals by the multi-channel splitter 412. The predetermined number of coherent dithering signals is equal to the number of the receiving channels 13.

As described above, when desired, the coherent dithering signals can be processed by the filter 414 to limit a frequency band of the dither signal. Likewise, when desired, prior to splitting, a magnitude of said dither signal can be set to an optimal level by the variable attenuator 415 and amplified by the amplifier 416.

Then, the predetermined time delays are applied to the coherent dithering signals in the receiving channels 13, correspondingly. In each receiving channel 13, the analog input signal originated by the corresponding antenna element 12 is received and added to the delayed coherent dithering signal having a corresponding predetermined time delay. As described above, the corresponding time delays are equivalent to a time delay of signals arriving from a certain specific direction selected from out-of-field-of-view of the antenna array. As a result, a combined analog signal including the corresponding delayed coherent dithering signal and the corresponding analog input signal is generated in each receiving channel 13.

According to an embodiment of the present invention, the method includes, in each receiving channel 13, digitizing the combined analog signal by the analog-to digital converters (ADCs) 132 to obtain the predetermined number of combined digital signals having a decorrelated quantization noise. As will be illustrated hereinbelow, the system and method of the present invention can effectively enhance a dynamic range of a multi-channel digital receiver even when the ADC 132 is a simple mono-bit AD converter.

The effect of adding a dither signal on a dynamic range of a single receiving channel 13 implemented with a simple mono-bit AD converter is shown in FIGS. 5A through 5D, which show results of simulations of a power spectrum for a signal having two tones at frequencies of $F_1$=0.63 GHz and $F_2$=0.93 GHz, correspondingly.

Figure 5A:
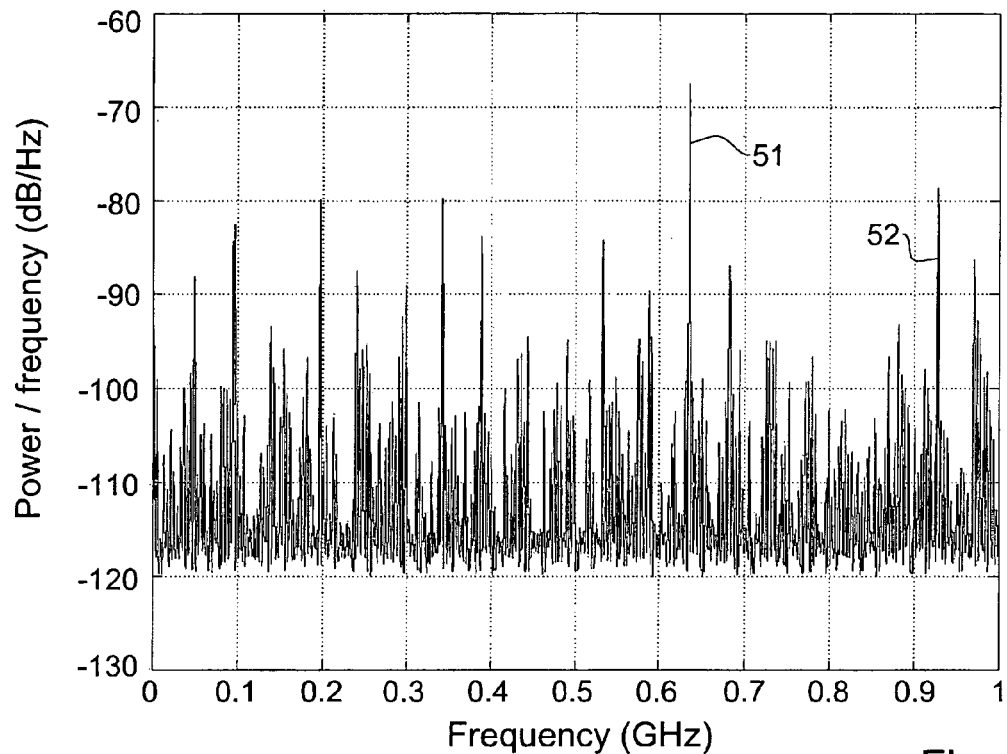
FIGS. 5A and 5C illustrate examples of a power spectrum obtained by computer simulations of a received two-tone signal digitized without adding a dithering signal for a single receiving channel.

FIG. 5A illustrates an example obtained by computer simulations of a power spectrum of a received two-tone signal digitized without adding a dithering signal, when the difference between levels $P_1$ and $P_2$ of the tones is relatively small and equals 6 dB. As can be seen in this figure, the tones indicated by reference numerals 51 and 52 corresponding to the frequencies $F_1$ and $F_2$, respectively, can hardly be distinguished from the quantization noise that includes spurs having amplitude of the same order as level $P_2$.

Figure 5B:
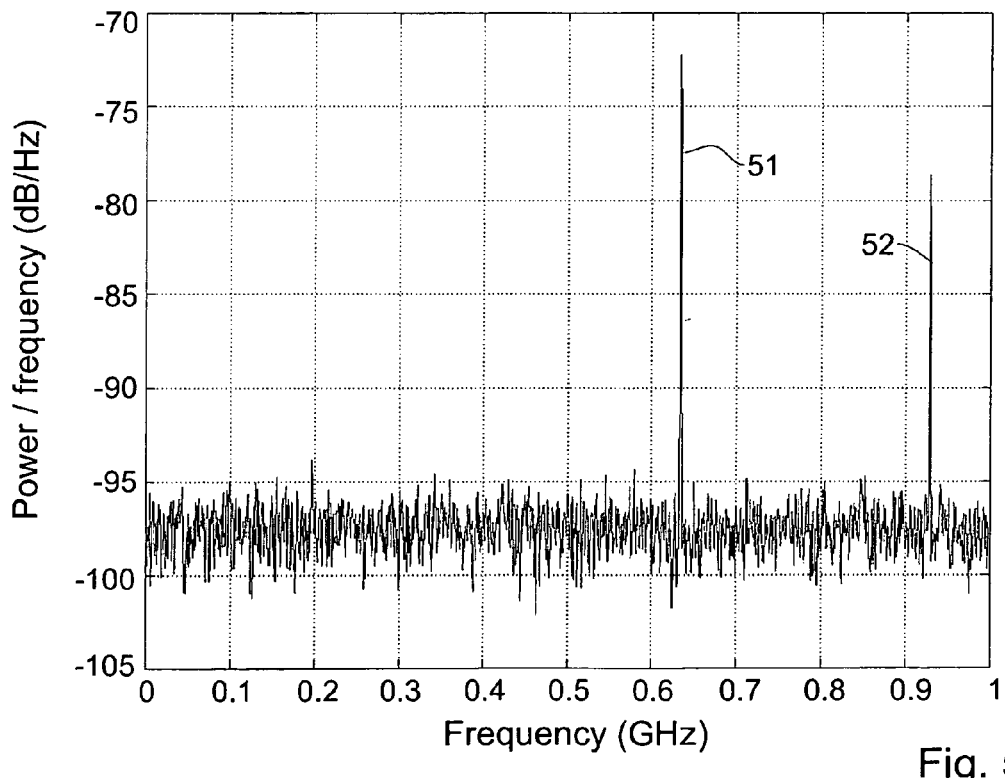
FIGS. 5B and 5D illustrate examples obtained by computer simulations of the received power spectra when a dither signal in the form of random white noise is added to the received signal before digitizing by an analog-to-digital converter.
Figure 5C:
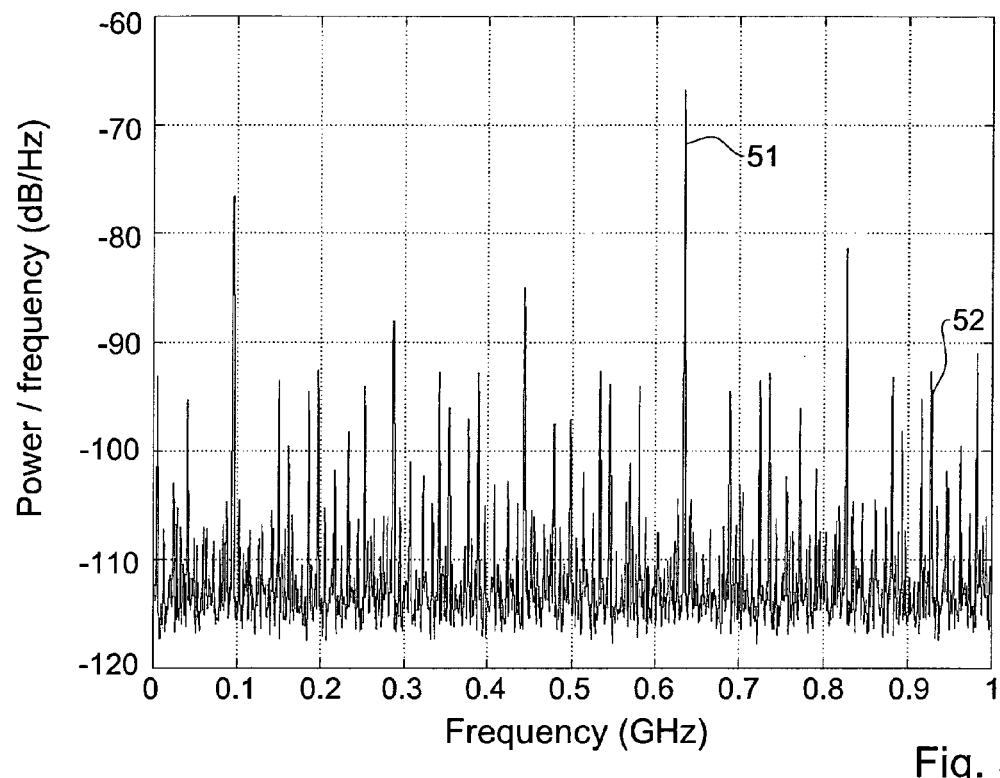

The possibility to distinguish the tones 51 and 52 from the quantization noise significantly deteriorates when the difference between the received signal levels $P_1$ and $P_2$ becomes relatively great. FIG. 5C illustrates an example obtained by computer simulations of the power spectrum of a received two-tone signal digitized without adding a dithering signal, when the difference between the received signal levels $P_1$ and $P_2$ equals 20 dB. As can be seen in this figure, only tone 51 corresponding to the frequency $F_1$ can be distinguished from the quantization noise, whereas tone 52 corresponding to the frequency $F_2$ cannot be distinguished from the quantization noise, since some of the spurs have amplitudes greater than the received signal level $P_2$.

Figure 5D:
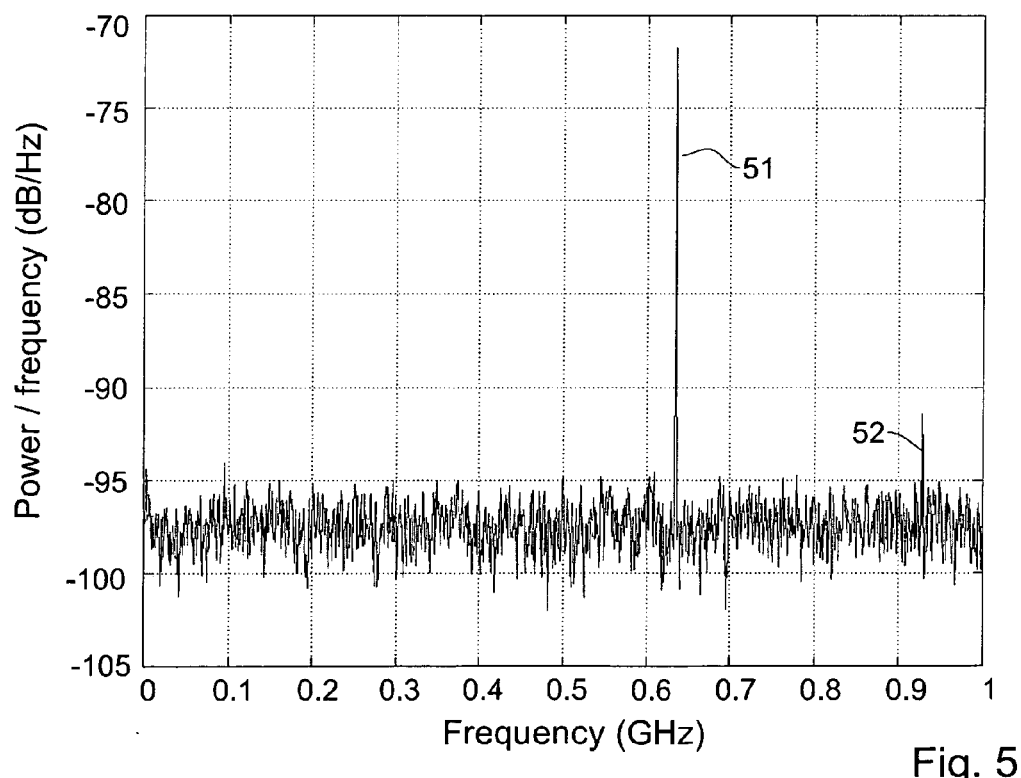

The dithering procedure enhances the dynamic range. Thus, FIGS. 5B and 5D illustrate examples obtained by computer simulations of the received power spectra when a dither signal in the form of random white noise is added to the received signal before digitizing by an analog-to-digital converter. Thus, the tones indicated by reference numerals 51 and 52 corresponding to the frequencies $F_1$ and $F_2$, respectively, can be clearly distinguished from the quantization noise not only in the case when the difference between the received signal levels $P_1$ and $P_2$ is relatively small, i.e. equals 6 dB (FIG. 5B), but also when the difference between the received signal levels $P_1$ and $P_2$ is relatively great, and equals 20 dB (FIG. 5D). It should be noted that when the difference between the received signal levels $P_1$ and $P_2$ is greater than 20 dB, the possibility to distinguish the tone 52 from the quantization noise becomes complicated for a single channel system.

The "spatial" dithering scheme proposed in the present application provides a significant enhancement of the dynamic range of the receiver. FIGS. 6A-6C; 7A-7C; and 8A-8C illustrate the effect of adding a delayed dithering signal with a predetermined time delay for each channel on a dynamic range for an electronically steered antenna array of a beam forming multi-channel receiver implemented with a simple mono-bit AD converters.

The computer simulations were carried out for a beamforming multi-channel receiver including 32×32 antenna elements and 1024 channels configured for receiving two signals at frequencies of $F_1$=0.63 GHz and $F_2$=0.93 GHz simultaneously generated by two transmitters. Signals received from the first transmitter have a power level higher than the signals received from the second transmitter.

The first transmitter is arranged at an azimuth angle of 80 degrees and an elevation angle of 80 degrees. This arrangement corresponds to the direction of 10 degrees from a boresight of the steered antenna array. The second transmitter is arranged at an azimuth angle of 60 degrees and an elevation angle of 60 degrees. This arrangement corresponds to the direction of 30 degrees from a boresight of the steered antenna array. The injected dither signal was used as a wide band noise signal arriving from a direction out of antenna coverage area at an azimuth angle of 0 degrees and an elevation angle of 0 degrees. The predetermined time delays between the channels were set to predetermined values taking into account the location of the antenna elements 12 and the distance therebetween.

FIGS. 6A-6C illustrate examples of a power spectrum of signals received from two transmitters by a beamforming multi-channel receiver when a beam is pointed towards the first transmitter.

Specifically, FIG. 6A shows the power spectrum of the received signal that is digitized without adding a dithering signal, when the difference between levels $P_1$ and $P_2$ of the first and second signals is relatively great and equals 43 dB. As can be seen in this figure, only the first signal at the frequency $F_1$ (indicated by a reference numeral 61) that has a higher power level, can be distinguished from the quantization noise. Additionally, low level spurious signals can be seen well below the level $P_1$ (designated by a reference numeral 61)

FIGS. 6B and 6C show the power spectrum of the received signals when a dither signal in the form of random white noise is added to the received signals before digitizing by an analog-to-digital converter. FIG. 6B corresponds to the case when difference between levels $P_1$ and $P_2$ of the first and second signals equals 13 dB, whereas FIG. 6C corresponds to the case when difference between levels $P_1$ and $P_2$ of the first and second signals equals 43 dB. As can be seen in FIGS. 6B and 6C, the first signal at the frequency $F_1$ (indicated by a reference numeral 61) can be clearly distinguished from the quantization noise. No spurious signals can be distinguished from the noise.

FIGS. 7A-7C illustrate examples of a power spectrum of signal received from two transmitters by a beamforming multi-channel receiver when a beam is pointed towards the second transmitter.

FIG. 7A shows the power spectrum of the received signal that is digitized without adding a dithering signal, when the difference between levels $P_1$ and $P_2$ of the first and second signals is relatively great and equals 43 dB. As can be seen in this figure, when the signal at the frequency $F_2$ (indicated by a reference numeral 71) received from the second transmitter has a power level lower that the power level of the signal received from the first transmitter, the first and second signals cannot be distinguished from the quantization noise, since some of the spurs have amplitudes greater than the received levels of the first and second signals.

However the dynamic range is enhanced when a dithering signal is added, as described hereinabove. In particular, FIGS. 7B and 7C show the power spectrum of the received signals when a dither signal, in the form of random white noise, is added to the received signals before digitizing by an analog-to-digital converter. FIG. 7B corresponds to a case where the difference between levels $P_1$ and $P_2$ of the first and second signals equals 13 dB, whereas FIG. 7C corresponds to a case where the difference between levels $P_1$ and $P_2$ of the first and second signals equals 43 dB. As can be seen in FIGS. 7B and 7C, the second signal 71 at the frequency $F_2$ can be clearly distinguished from the quantization noise not only in cases where the difference between the received signal levels $P_1$ and $P_2$ is relatively small, i.e. equals 13 dB (FIG. 7B), but also when the difference between the received signal levels $P_1$ and $P_2$ is great, and equals 43 dB (FIG. 7C).

FIGS. 8A-8C illustrate examples of a power spectrum of signals received from two transmitters by a beamforming multi-channel receiver when a beam is pointed towards direction between these transmitters without any other transmitters within the beam.

FIG. 8A shows the power spectrum of the received signal that is digitized without adding a dithering signal, when the difference between levels $P_1$ and $P_2$ of the first and second signals is relatively great and equals 43 dB. As can be seen in this figure, when the beam is pointed between these transmitters, the first and second signals cannot be distinguished from the noise, as expected, however a number of spurs have amplitudes well above the noise level. These spurious signals may cause false alarm and detection of not existing signals.

However the dynamic range is enhanced when a dithering signal is added, as described hereinabove. In particular, FIGS. 8B and 8C show the power spectrum of the received signals when a dither signal, in the form of random white noise, is added to the received signals before digitizing by an analog-to-digital converter. FIG. 8B corresponds to a case when the difference between levels $P_1$ and $P_2$ of the first and second signals equals 13 dB, whereas FIG. 8C corresponds to a case when the difference between levels $P_1$ and $P_2$ of the first and second signals equals 43 dB. In both FIGS. 8B and 8C, as expected, no any signals (including the signals at frequencies $F_1$ and $F_2$ and spurious signals) can be distinguished from the noise level.

Turning back to FIG. 4, the system 40 includes the digital beam forming unit 43 arranged downstream of the receiver channels 13, and a signal processor unit 44 arranged downstream of the digital beam forming unit 43. After digitizing by the analog-to digital converters (ADCs) 132, the combined digital signals corresponding to the plurality of receiving channels 13 are relayed to the digital beam forming unit 43 that computes a digital beam associated with the electromagnetic signals arriving from a certain specific direction, while attenuating the electromagnetic signals arriving from other directions.

A digital counterpart waveform of the delayed coherent dithering signals added to the analog input signals that correspond to directions other than the field-of-view can be removed from the combined digital signals by the digital beam forming unit 43. The removing of the digital counterpart waveform of the delayed coherent dithering signals can, for example, be carried out by a null-steering technique.

The system 40 further includes a signal processor unit 44 arranged downstream of the digital beam forming unit 43. The signal processor unit 44 is configured for processing the digital beam associated with the electromagnetic signal arriving from the direction of the field-of-view. In processing, the signal processor unit 44 selects beams, performs filtering in frequency domain, signal detection, and estimates required signal parameters.

It should be understood that the system for enhancing a dynamic range of a multi-channel digital receiver can be associated with a suitably programmed computer system having, inter alia, such known utilities as a processor (not shown), a memory unit (not shown) for storing the processed data. The processor is preprogrammed by a suitable software model capable of processing signals. Accordingly, the processor can perform a number of data processing steps, calculations, or estimating functions, some of which have been discussed above. It should also be understood that the present invention contemplates a computer program being run by the computer system for executing the method of the invention. The invention further contemplates a machine-readable memory tangibly embodying a program of instructions executable by the machine for executing the method of the invention.

Those skilled in the art to which the present invention pertains, can appreciate that while the present invention has been described in terms of preferred embodiments, the concept upon which this disclosure is based may readily be utilized as a basis for the designing of other structures, systems and processes for carrying out the several purposes of the present invention.

It should be noted that although the dithering module shown in FIG. 4 includes a generator for producing a random noise waveform or a band limited random noise waveform, generally many different types of waveforms may also be suitable for use as the dither signal for the purpose of the present invention. For example, a dither signal comprising a staircase waveform may be utilized and is described in more detail in U.S. Pat. No. 4,144,577. A dither signal comprising a saw-tooth or triangle waveform may be utilized and is described in more detail in U.S. Pat. No. 5,305,005. A dither signal comprising a ramp waveform that is created digitally may be utilized and is described in more detail in U.S. Pat. No. 4,800,364. A dither signal comprising a square wave waveform may be utilized and is described in more detail in U.S. Pat. No. 3,656,152. Other types of dither signals not mentioned above may also be utilized, which can be effective at achieving the desired improvement in conversion accuracy of the ADC, and accordingly improvement of the dynamic range of the multi-channel digital receiver of the present invention.

Also, it is to be understood that the phraseology and terminology employed herein are for the purpose of description and should not be regarded as limiting.

Finally, it should be noted that the word "comprising" as used throughout the appended claims is to be interpreted to mean "including but not limited to".

It is important, therefore, that the scope of the invention is not construed as being limited by the illustrative embodiments set forth herein. Other variations are possible within the scope of the present invention as defined in the appended claims. Other combinations and sub-combinations of features, functions, elements and/or properties may be claimed through amendment of the present claims or presentation of new claims in this or a related application. Such amended or new claims, whether they are directed to different combinations or directed to the same combinations, whether different, broader, narrower or equal in scope to the original claims, are also regarded as included within the subject matter of the present description.

The invention claimed is:

1. A system for enhancing a dynamic range of a beamforming multi-channel digital receiver, comprising:
    an antenna array comprising a plurality of antenna elements and configured for receiving electromagnetic signals and generating analog input signals;

a plurality of parallel receiving channels coupled to the antenna elements; each parallel receiving channel comprising an analog-to-digital (AD) converter;

a dithering module comprising:
- a dither signal generator configured for generating a dither signal including a dither waveform,
- a multi-channel splitter arranged downstream of the dither signal generator and configured for splitting said dither signal into a predetermined number of coherent dithering signals assigned to said plurality of parallel receiving channels, and
- a plurality of time delay units arranged downstream of the multi-channel splitter in a parallel relation, each time delay unit being configured for providing a predetermined time delay to the coherent dithering signal in the corresponding receiving channel; and a plurality of combiners arranged in said plurality of parallel receiving channels upstream of the analog-to-digital converters and coupled to the time delay units; each combiner configured for receiving the analog input signal originating from the corresponding antenna element and adding the delayed coherent dithering signal having the corresponding predetermined time delay to the analog input signal, generating a combined analog signal including said delayed coherent dithering signal and said analog input signal, and relaying said combined analog signal to the analog-to-digital converter for digitizing thereof; and a digital beam forming unit arranged downstream of said plurality of parallel receiving channels and coupled to the analog-to-digital converters, and configured for receiving combined digital signals digitized by the analog-to-digital converters, and computing a digital beam associated with the electromagnetic signals arriving from a certain specific direction, while attenuating the electromagnetic signals arriving from other directions.

2. The system of claim 1, wherein the corresponding time delays provided by the time delay units are equivalent to time delays of the signals arriving from a specific direction.

3. The system of claim 2, wherein the digital beam forming unit is further configured for removing, from the combined digital signals, a digital counterpart waveform of the delayed coherent dithering signals added to the analog input signals corresponding to said specific direction.

4. The system of claim 2, wherein said specific direction is selected from out-of-field-of-view of the antenna array.

5. The system of claim 1, further comprising a signal processor unit arranged downstream of the digital beam forming unit and configured for processing the digital beam associated with the electromagnetic signal arrived from the certain specific direction, said processing including estimating required parameters associated with said electromagnetic signal arrived from the certain specific direction.

6. The system of claim 1, wherein the dithering module further comprises a filter arranged downstream of the dither signal generator and configured for limiting a frequency band of said dither signal.

7. The system of claim 1, wherein said dither signal includes a random noise waveform.

8. The system of claim 7, wherein the frequency band of said random noise waveform which is out-of-band with respect to the analog input signals.

9. The system of claim 1, wherein said dither signal generator includes a noise source configured for generating a random noise waveform.

10. The system of claim 1, wherein the dithering module further comprises a variable attenuator arranged upstream of the multi-channel splitter, and configured for setting a magnitude of said dither waveform to an optimal level.

11. The system of claim 10, wherein the optimal level is in the range of −3 dB to 3 dB of the maximum operational signal level of the analog input signal.

12. The system of claim 1, wherein the analog-to-digital converter is a mono-bit AD converter.

13. A method for enhancing a dynamic range of a beamforming multi-channel digital receiver comprising an array of antenna elements receiving electromagnetic signals and generating analog input signals, and a plurality of receiving channels coupled to the array of antenna elements, the method comprising:

generating a dither signal;

splitting said dither signal into a predetermined number of coherent dithering signals, said predetermined number being equal to the number of the receiving channels;

providing predetermined time delays to the coherent dithering signals in the receiving channels, correspondingly; and in each receiving channel,
- receiving the analog input signal originating from the corresponding antenna element, and adding this signal to a delayed coherent dithering signal having a corresponding predetermined time delay, thereby generating a combined analog signal including the corresponding delayed coherent dithering signal and the corresponding analog input signal,
- digitizing said combined analog signal, thereby obtaining a combined digital signal having a reduced quantization noise;

receiving combined digital signals corresponding to said plurality of receiving channels, and computing a digital beam associated with the electromagnetic signals arriving from a certain specific direction, while attenuating the electromagnetic signals arriving from other directions.

14. The method of claim 13, wherein said predetermined time delays are equivalent to time delays of signals arriving from a specific direction selected from an out-of-field-of-view of the antenna array.

15. The method of claim 14, further comprising removing, from the combined digital signals, a digital counterpart waveform of the delayed coherent dithering signals added to the analog input signals corresponding to said specific direction.

16. The method of claim 13, further comprising processing the digital beam associated with the electromagnetic signal arriving from the certain specific direction; said processing including estimating required parameters associated with said electromagnetic signal arriving from the certain specific direction.

17. The method of claim 13, wherein said generating of the dither signal includes generating a random noise waveform.

18. The method of claim 13, further comprising limiting a frequency band of said dither signal prior to splitting thereof.

19. The method of claim 13, further comprising setting a magnitude of said dither signal to an optimal level prior to splitting thereof.

20. The method of claim 19, wherein the optimal level is in the range of approximately −3 dB to 3 dB of the maximum operational signal level of the analog input signal.

* * * * *